US006046942A

United States Patent [19]

Hwang et al.

[11] Patent Number: 6,046,942

[45] Date of Patent: Apr. 4, 2000

[54] OUTPUT BUFFER INCLUDING AN APPLICATION-SPECIFIC SRAM MEMORY CELL FOR LOW VOLTAGE, HIGH SPEED OPERATION

[75] Inventors: Yi-Ren Warry Hwang, Fremont; Luigi DiGregorio, Sunnyvale, both of Calif.

[73] Assignee: Advanced Micro Devices, Inc., Sunnyvale, Calif.

[21] Appl. No.: 09/157,708

[22] Filed: Sep. 21, 1998

Related U.S. Application Data

[62] Division of application No. 08/939,016, Sep. 26, 1997, Pat. No. 5,870,331.

[51] Int. Cl.[7] .................... G11C 16/04

[52] U.S. Cl. .................... 365/189.05; 365/154

[58] Field of Search .................... 365/189.05, 208, 365/207, 205, 154

[56] References Cited

U.S. PATENT DOCUMENTS

| | | | |
|---|---|---|---|
| 5,047,979 | 9/1991 | Leung | 365/154 |
| 5,307,322 | 4/1994 | Usami et al. | 365/230.05 |
| 5,473,562 | 12/1995 | Liu | 365/154 |
| 5,493,536 | 2/1996 | Aoki | 365/230.05 |
| 5,532,958 | 7/1996 | Jiang et al. | 365/154 |
| 5,768,178 | 6/1998 | McLaury | 365/154 |
| 5,796,665 | 8/1998 | Ternullo, Jr. et al. | 365/154 |
| 5,864,511 | 1/1999 | Sato | 365/154 |

*Primary Examiner*—David Nelms
*Assistant Examiner*—VanThu Nguyen
*Attorney, Agent, or Firm*—Skjerven, Morrill, MacPherson, Franklin & Friel LLP; Ken J. Koestner

[57] ABSTRACT

An application-specific SRAM memory cell includes first and second cross-coupled inverters coupled at first and second nodes for storing a bit of information at the first node and a complement of the bit at the second node, first and second series-connected transistors for coupling a write data signal to the first node in response to a write address signal and a clock having high logical values, third, fourth and fifth series-connected transistors for coupling the second node to ground in response to the write data signal, the write address signal and the clock having high logical values, a sixth transistor for coupling the bit to a read data line in response to a read address signal having a high logical value, a seventh transistor for coupling the complement of the bit to a third node in response to the read address signal having a high logical value, an eighth transistor for coupling the read data line to a power supply terminal in response to the third node having a low logical value, and a ninth transistor for coupling the third node to the power supply terminal in response to the read data line having a low logical value. In memory structures such as register files or arrays, the eighth and ninth transistors provide an output stage that can be shared by each memory cell coupled to the read data line.

7 Claims, 4 Drawing Sheets

400 WA0 CLK 402 RA0 404 Vdd 464 232 434 214 236 430 220 222 216 244 224 460 462 438 446 WD RD 240 212 242 200 256 250 258 252 WA1 RA1 254 332 314 336 320 322 316 344 324 340 312 342 300 356 350 358 352 354 To Other Memory Cells To Other Memory Cells To Other Memory Cells To Other Memory Cells

OUTPUT BUFFER INCLUDING AN APPLICATION-SPECIFIC SRAM MEMORY CELL FOR LOW VOLTAGE, HIGH SPEED OPERATION

This application is a division of Ser. No. 08/939,016 filed Sep. 26, 1997 U.S. Pat. No. 5,870,331.

BACKGROUND OF THE INVENTION

1. Field of the Invention

The present invention relates to electronic circuits, and more particularly to memory cells for storing digital information.

2. Description of Related Art

Semiconductor memories are vital components for mainframe and personal computers, telecommunications, automotive and consumer electronics, and commercial and military avionics systems. Semiconductor memories are characterized as volatile random access memories (RAMs) or nonvolatile devices. RAMs can either be static mode (SRAMs) where digital information is stored by setting the logic state of a bistable device, or dynamic mode (DRAMs) where digital information is stored through periodic charging of a capacitor.

SRAM is typically arranged as a matrix of memory cells fabricated in an integrated circuit chip, and address decoding functions in the chip allow access to each cell for read/write functions. SRAM memory cells use active feedback in the form of cross-coupled inverters to store a bit of information as a logical "0" or a logical "1". The active elements in the memory cells need a constant source of power to remain latched in the desired state. The memory cells are often arranged in rows so that blocks of data such as words or bytes can be written or read simultaneously. Address multiplexing is used to reduce the number of input and output pins. SRAMs have undergone dramatic increases in density. For instance, 16 megabit SRAMs have been developed with 0.4 micron CMOS technology.

SRAM memory cells have many variations. The basic CMOS SRAM cell consists of two transistors and two load elements in a cross-coupled inverter configuration, with two select transistors added to make up a six-transistor cell. Polysilicon load resistors have been used instead of PMOS transistors to reduce cell size. Furthermore, there are application-specific variations of the basic SRAM cell. Application-specific SRAMs include extra logic circuitry to make them compatible for a specific task. For instance, an eight-transistor, double-ended, dual-port cell can be accessed through both ports and is useful in cache architectures embedded in memory of a microprocessor. A nine-transistor content-addressable memory (CAM) cell is used in applications where both the contents and location of the cell must be known.

FIG. 1 is a circuit diagram of a conventional application-specific SRAM memory cell. Memory cell 10 includes cross-coupled inverters 12 and 14, inverters 16 and 18, N-channel MOS transistors 20, 22 and 24, and P-channel MOS transistor 26. Write data line 30 applies a write data (WD) signal to the drain of transistor 20, write address line 32 applies a write address (WA) signal to the gate of transistor 20, clock line 34 applies a clock (CLK) to the gate of transistor 22, read address line 36 applies a read address (RA) signal to the gate of transistor 24 and to inverter 18, and read data line 38 outputs a read data (RD) signal The write data signal provides a bit of information to be written into memory cell 10, the write address signal selects memory cell 10 for a write operation, the clock provides timing synchronization for the write operation, and the read address signal selects memory cell 10 for a read operation in which the stored bit is provided as the read data signal.

During a write operation, initially the write data signal assumes a logical value and the write address signal is high to select memory cell 10. Thereafter, the clock goes high, the write data signal and the write address signal remain stable while the clock is high, and transistors 20 and 22 couple the write data signal to node 40. The write data signal determines the logical value of node 40. If the write data signal and node 40 have identical logical values then node 40 retains this logical value. Alternatively, if the write data signal and node 40 have different logical values then the write data signal changes the logical value of node 40, and inverter 12 changes the logical value of node 42. Thereafter, the clock goes low, and inverter 14 functions as a "keeper" to prevent node 40 from drifting to another logical value. Accordingly, inverters 40 and 42 latch the write data signal and store a bit of information at node 40 with the same logical value as the write data signal. In addition, inverter 12 provides a complement of the bit at node 42, and inverter 16 provides a double complement of the bit, which is equivalent to the bit, at node 44. Thus, nodes 40 and 44 have identical logical values. In addition, inverter 16 provides a buffer to protect nodes 40 and 42 from the read operation.

During a read operation, the read data signal goes high to select memory cell 10. Transistors 24 and 26 in combination with inverter 18 provide a transmission gate that opens when the read data signal is high and closes when the read data signal is low. Accordingly, when the read address signal is high, transistors 24 and 26 couple node 44 to read data line 38 to provide the read data signal with the same logical value as the stored bit. Although transistor 24 alone could provide a switch for coupling read data line 38 to node 44 in response to the read address signal, this would introduce a threshold voltage ($V_{TN}$) drop between read data line 38 and node 44 when the stored bit has a high logical value.

Memory cell 10 is particularly well-suited for providing a flexible building block for a large memory array. For instance, memory cell 10 can receive multiple read address lines for driving multiple read data lines by replicating the combination of inverter 18 and transistors 24 and 26. Unfortunately, memory cell 10 has several drawbacks.

Memory cell 10 includes a critical speed path between write data line 30 and node 40 during write operations. When the write data signal is high and node 40 is low, transistor 20 introduces a threshold voltage ($V_{TN}$) drop between write data line 30 and node 40 which increases the time needed for the voltage at node 40 to reach the trip point of inverter 12. Increasing the sizes of transistors 20 and 22 increases their drive currents and therefore increases the rate at which node 40 charges, however this approach also increases the loading for write address line 32 and clock line 34, thereby causing other time delays, and requires more surface area. Furthermore, as the supply voltage decreases, the write data signal requires even more time to charge node 40.

Memory cell 10 also includes a critical speed path between read address line 36 and read data line 38 during read operations. Read address line 36 is coupled to transistor 24 and inverter 18, which includes an N-channel transistor and a P-channel transistor (not shown). These three transistors each increase the loading for read address line 36, thereby increasing time delays. In addition, since P-channel transistors tend to be slower than N-channel transistors (due to the greater mobility of electrons than holes), it is often undesirable to place a P-channel transistor in the critical speed path. Inverter 18 and transistor 26 are not essential, however, as mentioned above, they prevent a threshold voltage ($V_{TN}$) drop between read data line 38 and node 44 when the stored bit has a high logical value, which becomes especially important during low-voltage operation. Inverter 18 can be removed by providing true and complementary read address signals, however this doubles the number of read address lines and requires significantly more surface area.

Thus, memory cell 10 suffers from speed limitations that become progressively worse as the power supply voltage decreases. As a result, memory cell 10 is not well-suited for low voltage, high speed operations, particularly with supply voltages on the order of 1.2 volts.

Low voltage operation is becoming increasing popular in a wide variety of applications. For instance, low voltage operation reduces power dissipation, which is critical for portable electronics such as laptop computers and cellular telephones with limited operating times between battery recharging. In addition, low voltage operation increases the reliability of integrated circuit chips. For instance, as MOS transistor dimensions are reduced, the electric field in the channel region near the drain tends to increase. If the electric field becomes strong enough, it can give rise to hot-carrier effects, in which electrons are injected into the gate insulator and change the threshold voltage of the device. Reducing the supply voltage reduces the electric field giving rise to hot-carrier effects.

Accordingly, a need exists for an application-specific SRAM memory cell that is well-suited for low voltage, high speed operation.

SUMMARY OF THE INVENTION

The present invention provides an application-specific SRAM memory cell which fulfills the need in the art described above.

In accordance with one aspect of the invention, a memory cell includes first and second cross-coupled inverters coupled at first and second nodes for storing a bit of information at the first node and a complement of the bit at the second node, first and second series-connected switching elements for coupling a write data signal to the first node in response to a write address signal and a clock, and third, fourth and fifth series-connected switching elements for coupling the second node to a power supply terminal in response to the write data signal, the write address signal and the clock. Preferably, the first and second switching elements are N-channel transistors that couple the write data signal to the first node in response to the write address signal and the clock having high logical values, and the third, fourth and fifth switching elements are N-channel transistors that couple the second node to ground in response to the write data signal, the write address signal and the clock having high logical values. In this manner, a write data signal with a high logical value causes the first and second nodes to change logic states using circuitry external to the cross-coupled inverters, thereby increasing speed.

In accordance with another aspect of the invention, a memory cell includes first and second cross-coupled inverters coupled at first and second nodes for storing a bit of information at the first node and a complement of the bit at the second node, a first switching element for coupling the bit to a read data line in response to a read address signal, a second switching element for coupling the complement of the bit to a third node in response to the read address signal, a third switching element for coupling the read data line to a power supply terminal in response to a first logical value at the third node, and a fourth switching element for coupling the third node to the power supply terminal in response to the first logical value at the read data line. Preferably, the first and second switching elements are N-channel transistors that couple the first and second nodes to the read data line and the third node, respectively, in response to the read address signal having a high logical value, and the third and fourth switching elements are P-channel transistors that couple the read data line and the third node, respectively, to a positive supply voltage in response to the third node and the read data line, respectively, having low logical values. In this manner, the read address signal is loaded by only two N-channel transistors, thereby increasing speed, and the read data signal is pulled to the positive supply voltage without a threshold voltage drop when the bit being read has a high logical value.

These and other objects, features and advantages of the invention will be further described and more readily apparent from a review of the detailed description of the preferred embodiments which follows.

DETAILED DESCRIPTION OF THE PREFERRED EMBODIMENTS

Figure 1:
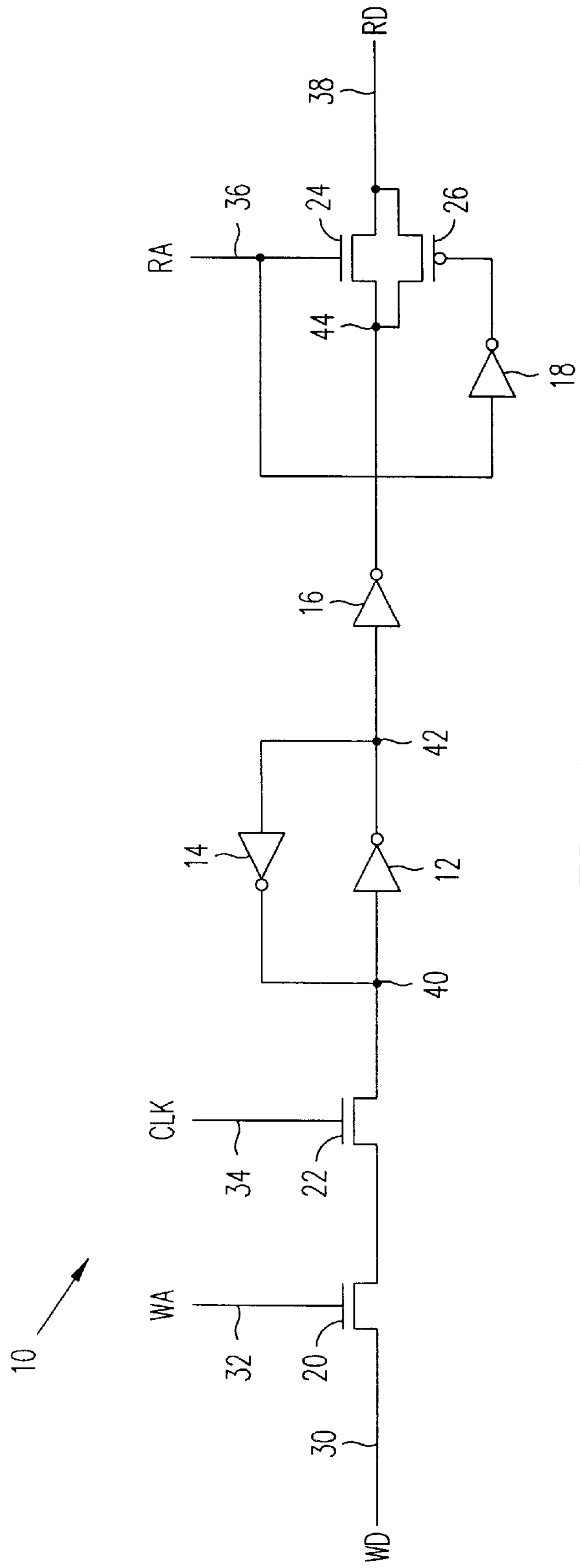
FIG. 1 is a circuit diagram of a conventional application-specific SRAM memory cell.
Figures 2, 3:
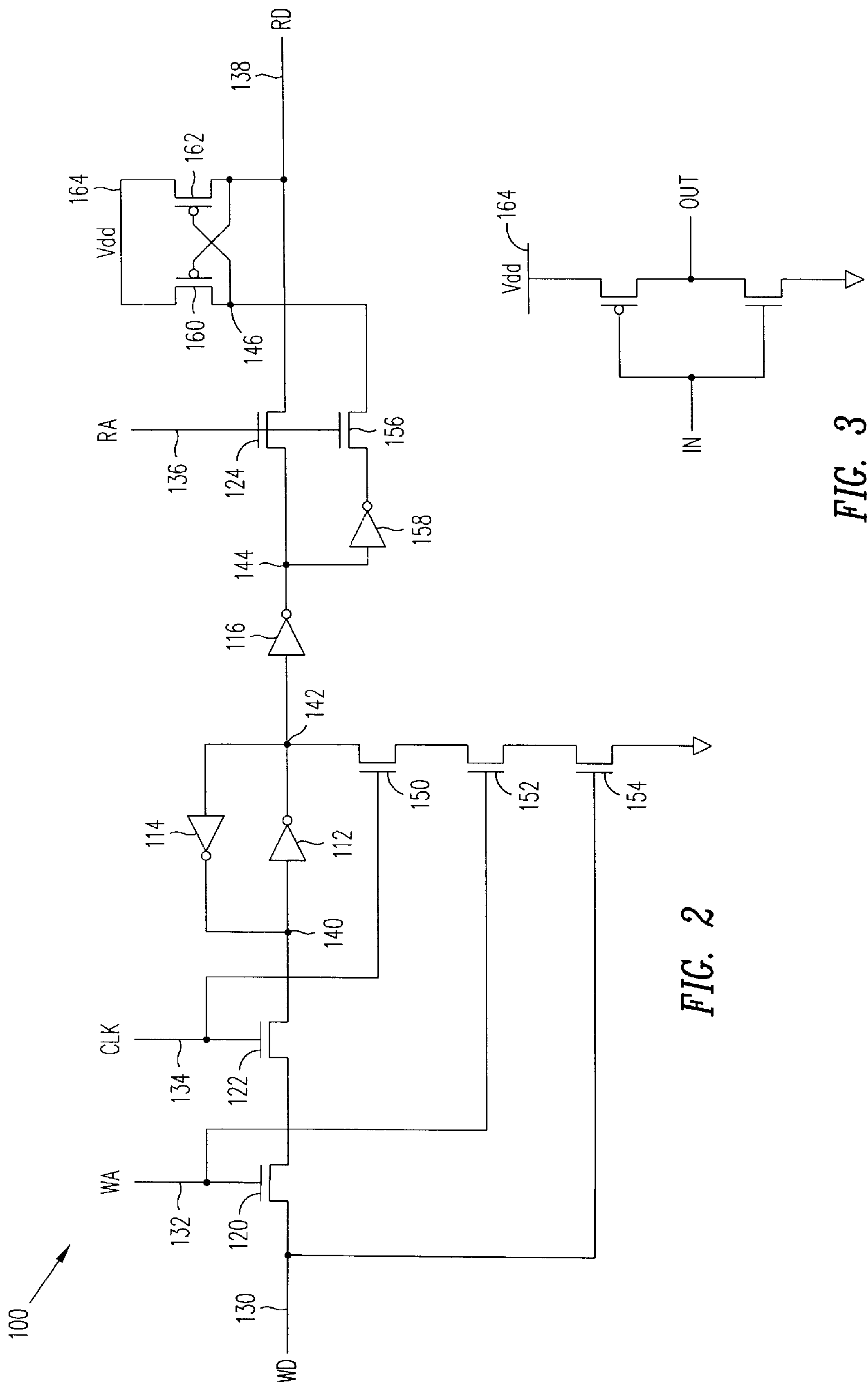
FIG. 2 is a circuit diagram of an application-specific SRAM memory cell in accordance with an embodiment of the present invention.
FIG. 3 is a circuit diagram of the inverters in the memory cell of FIG. 2.

FIG. 2 is a circuit diagram of an application-specific SRAM memory cell in accordance with an embodiment of the present invention. Memory cell 100 includes cross-coupled inverters 112 and 114, inverter 116, and N-channel MOS transistors 120, 122 and 124, which are essentially identical to cross-coupled inverters 12 and 14, inverter 16, and N-channel MOS transistors 20, 22 and 24, respectively, of memory cell 10. Similarly, memory cell 100 includes write data line 130, write address line 132, Clock line 134, read address line 136 and read data line 138 corresponding to lines 32, 34, 36, and 38, respectively, of memory cell 10. Memory cell 100 also includes nodes 140, 142 and 144 corresponding to nodes 40,42 and 44, respectively, of memory cell 10. Memory cell 100 does not include components corresponding to inverter 18 and transistor 26 of memory cell 10. In addition, unlike memory cell 10, memory cell 100 includes N-channel MOS transistors 150, 152, 154 and 156, inverter 158, and P-channel MOS transistors 160 and 162.

For illustration purposes, the power supply voltage for memory cell 100 is 1.2 V, the signals applied to memory cell 100 (i.e., the write data signal, read and write address signals, and the clock) have high logical values of 1.2 V (Vdd) and low logical values of 0 V (ground), and the N-channel threshold voltage ($V_{TN}$) and the P-channel threshold voltage ($V_{TP}$) have absolute magnitudes of about 0.5 to 0.6 V.

The clock is applied to the gate of transistor 150, the write address signal is applied to the gate of transistor 152, and the write data signal is applied to the gate of transistor 154. In addition, the drain of transistor 150 is coupled to node 142, and the source of transistor 154 is coupled to ground. Thus, series-connected transistors 150, 152 and 154 couple node 142 to ground when the write data signal, the write address signal and the clock are high.

A write operation occurs when the write address signal and the clock are high, thereby turning on transistors 120 and 122 which couple the write data signal to node 140. During a write operation when the write data signal is high (logical "1") and node 140 is initially at low (logical "0"), transistor 120 introduces a threshold voltage ($V_{TN}$) drop between write data line 130 and node 140 which increases the time it takes the write data signal to pull the voltage at node 140 to the trip point of inverter 112. Since node 140 is initially at ground, node 142 is initially high (1.2 V). Advantageously, as the write operation begins, transistors 150, 152 and 154 turn on and rapidly discharge node 142 to ground. Thus, transistors 150, 152 and 154 decrease the time it takes the voltage at node 142 to reach the trip point of inverter 114, and inverter 114 assists the write data signal with charging node 140. As a result, the logical states at nodes 140 and 142 change approximately 100 to 200 picoseconds faster than the logical states change at nodes 40 and 42 under similar conditions.

Transistors 150, 152 and 154 have no appreciable affect on memory cell 100 during other operations of memory cell 100. For instance, during a write operation when the write data signal is high and node 140 is initially high, node 142 is initially low, and therefore the virtual ground provided by transistors 150, 152 and 154 does not affect node 142. During a write operation when the write data signal is low, transistor 154 is turned off which prevents transistors 150, 152 and 154 from affecting node 142. Likewise, when the write address signal is low transistor 152 is turned off, and when the clock is low transistor 150 is turned off thereby preventing transistors 150, 152 and 154 from affecting node 142.

Cross-coupled transistors 160 and 162 provide an output stage. Transistors 160 and 162 have their sources coupled to power supply terminal 164. The gate of transistor 160 and the drain of transistor 162 are coupled to read data line 138, and the drain of transistor 160 and the gate of transistor 162 are coupled to node 146. Read data line 138 and node 146 have complementary logical values. Therefore, when read data line 138 is low and node 146 is high, transistor 160 turns on and couples node 146 to power supply terminal 164, and transistor 162 turns off Similarly, when read data line 138 is high and node 146 is low, transistor 162 turns on and couples read data line 138 to power supply terminal 164, and transistor 160 turns off. Of importance, transistor 160 is relatively small, and transistor 162 is relatively large.

A read operation occurs when the read address signal is high, thereby turning on transistors 124 and 156. Turning on transistor 124 couples node 144 (or the stored bit) to read data line 138, and turning on transistor 156 couples the output of inverter 158 (or the complement of the bit) to node 146. Advantageously, read address line 136 is loaded by only two N-channel transistors, as compared with read address line 36 which is loaded by two N-channel transistors and a P-channel transistor.

During a read operation when node 144 is high and read data line 138 is initially at low, transistor 124 turns on and begins to charge read data line 138. An advantage of transistor 160 being relatively small is that it introduces relatively little loading for read data line 138. As the voltage at node 144 continues to charge read data line 138, eventually transistor 124 causes a threshold voltage ($V_{TN}$) drop between node 144 and read data line 138. In addition, since node 144 is high, the output of inverter 158 is low, and transistor 156 allows inverter 158 to discharge node 146. Another advantage of transistor 160 being relatively small is that inverter 158 can rapidly discharge node 146 while transistor 160 is turned on and supplies charge to node 146. When node 146 goes low, transistor 162 turns on and couples read data line 138 to power supply terminal 164, thereby pulling read data line 138 to the power supply voltage and eliminating the threshold voltage ($V_{TN}$) drop between node 144 and read data line 138. Once read data line 138 is coupled to the power supply voltage, transistors 124 and 160 turn off Thus, transistors 156, 160 and 162 and inverter 158 assure that the read data signal rapidly reaches a high logical value at the power supply voltage. An advantage of transistor 162 being relatively large is that it rapidly pulls read data line 138 to the power supply voltage.

Transistors 156, 160 and 162 and inverter 158 have no appreciable affect on memory cell 100 during other operations of memory cell 100. For instance, during a read operation when node 144 is high and read data line 138 is initially high, transistor 160 is initially turned off and remains turned off, transistor 162 is initially turned on and remains turned on, read data line 138 remains high. During a read operation when node 144 is low and read data line 138 is initially high, transistor 160 is initially turned off and transistor 162 is initially turned on. When transistor 124 turns on, inverter 116 draws charge from read data line 138 through transistor 124 while transistor 162 supplies charge to read data line 138. Since, however, the N-channel transistor (not shown) in inverter 116 is substantially larger than transistor 162, inverter 116 rapidly discharges read data line 138, thereby turning on transistor 160 which charges node 146. Although inverter 158 also supplies charge through transistor 156 to node 146, if transistor 160 was not present then transistor 156 would cause a threshold voltage ($V_{TN}$) drop between the output of inverter and node 146, and transistor 162 might not completely turn off Advantageously, transistor 160 assures that node 146 is pulled to the power supply voltage, thereby completely turning off transistor 162. Finally, during a read operation when node 144 is low and read data line 138 is initially low, transistor 160 is initially turned on and remains turned on, transistor 162 is initially turned off and remains turned off, and read data line 138 remains low.

Choosing the optimal sizes of transistors 124 and 156 involves a careful analysis of timing considerations. As transistors 124 and 156 become larger, the loading for read address line 136 increases (thereby delaying the read operation), but the rate at which inverter 116 discharges read data line 138 and the rate at which inverter 158 discharges node 146 also increases (thereby accelerating the read operation).

Memory cell 100 provides a read operation that is approximately 100 to 200 picoseconds faster than that of memory cell 10 under similar conditions. Moreover, transistors 160 and 162 can be shared by other memory cells similar to memory cell 100 which share read data line 138.

FIG. 3 is a circuit diagram of the inverters used in memory cell 100. As is seen, each of inverter 112, 114, 116 and 156 is a conventional basic CMOS inverter that includes an N-channel MOS transistor and P-channel MOS transistor.

Exemplary sizes for the transistors in memory cell 100 are listed below in Table 1. For convenience of explanation, the P-channel transistors in inverters 112, 114, 116 and 156 are referred to as transistors 112P, 114P, 116P and 158P, respectively, and the N-channel transistors in inverters 112, 114, 116 and 158 are referred to as transistors 112N, 114N, 116N and 158N, respectively.

TABLE 1

| Transistor | Channel Width (microns) | Channel Length (microns) |
|---|---|---|
| 112P | 4 | 0.4 |
| 112N | 2 | 0.4 |
| 114P | 1 | 0.4 |
| 114N | 1 | 0.9 |
| 116P | 11.1 | 0.4 |
| 116N | 13 | 0.4 |
| 120 | 3.9 | 0.4 |
| 122 | 3.9 | 0.4 |
| 124 | 5 | 0.4 |
| 150 | 3 | 0.4 |
| 152 | 3 | 0.4 |
| 154 | 3 | 0.4 |
| 156 | 5 | 0.4 |
| 158P | 11.1 | 0.4 |
| 158N | 13 | 0.4 |
| 160 | 1.5 | 0.4 |
| 162 | 8 | 0.4 |

Figure 4:
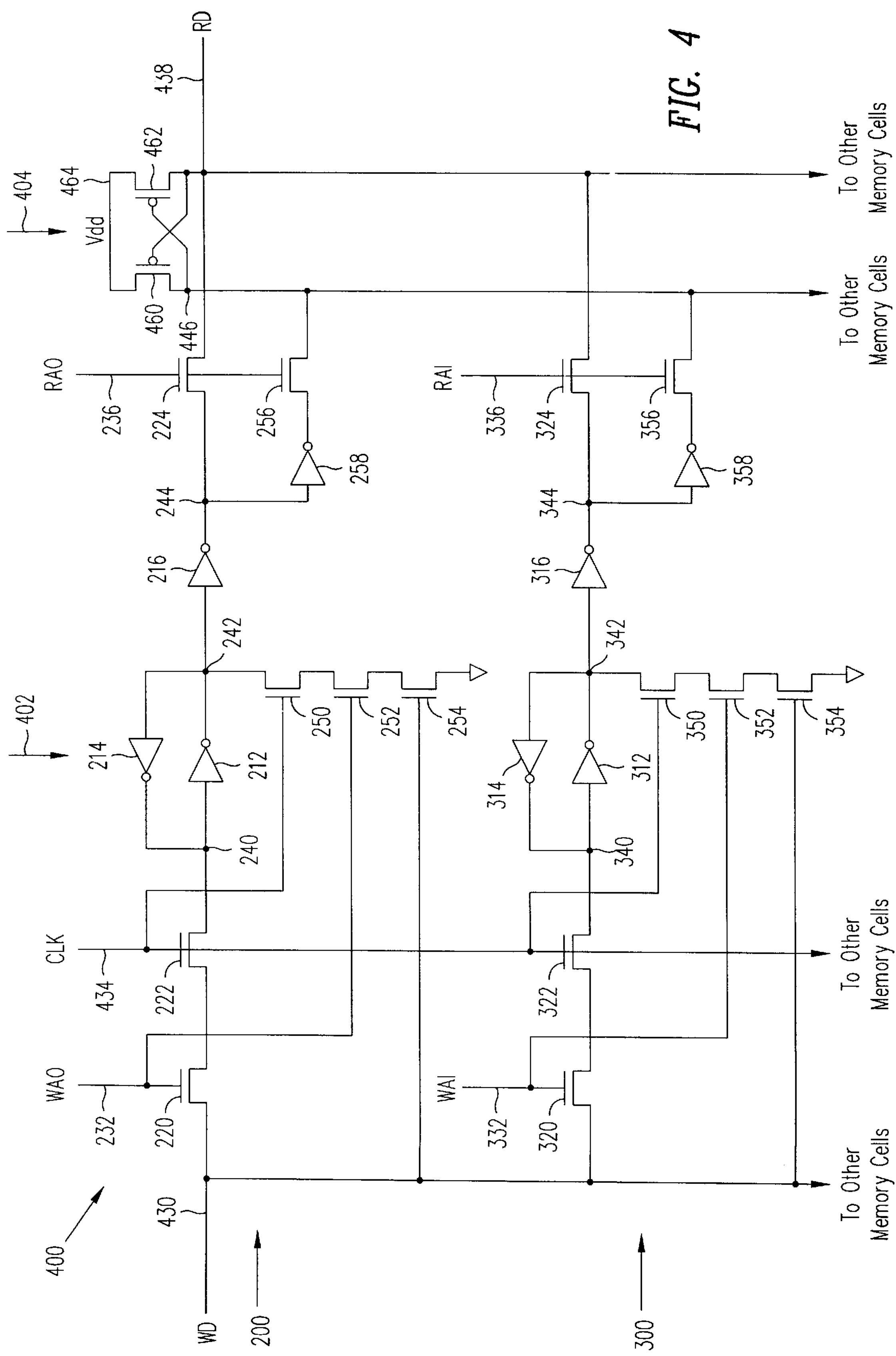
FIG. 4 is a circuit diagram of a pair of memory cells and a shared output stage using the memory cell of FIG. 2.

FIG. 4 is a circuit diagram of a pair of memory cells and a shared output stage. Although memory cell 100 is well-suited for providing the basic building block of memory structures such as a register file or a memory array, from a manufacturing standpoint it is preferred that the basic building block include two memory cells similar to memory cell 100 without the output stage (transistors 160 and 162). A pair of memory cells can be fabricated in a more compact manner than separate memory cells due to layout considerations.

As is seen, memory circuit 400 includes memory cell pair 402 and shared output stage 404. Memory cell pair 402 includes memory cell 200 and memory cell 300. Memory cell 200 includes transistors 220, 222, 224, 250, 252, 254, 256 and inverters 212, 214, 216 and 258 which are essentially identical to transistors 120, 122, 124, 150, 152, 154 and 156 and inverters 112, 114, 116 and 158, respectively. Cross-coupled-inverters 212 and 214 are coupled at nodes 240 and 242, and inverters 216 and 258 are coupled to node 244. Memory cell 300 includes transistors 320, 322, 324, 350, 352, 354, 356 and inverters 312, 314, 316 and 358 which are essentially identical to transistors 120, 122, 124, 150, 152, 154 and 156 and inverters 112, 114, 116 and 158, respectively. Cross-coupled inverters 312 and 314 are coupled at nodes 340 and 342, and inverters 316 and 358 are coupled to node 344.

Memory cell 200 is coupled to write address line 232 that applies a write address zero (WA0) signal to the gates of transistors 220 and 252, and similarly, memory cell 300 is coupled to write address line 332 that applies a write address one (WA1) signal to the gates of transistors 320 and 352. In addition, memory cell 200 is coupled to read address line 236 that applies a read address zero (RA0) signal to the gates of transistors 224 and 256, and memory cell 300 is coupled to read address line 336 that applies a read address one (RA1) signal to the gates of transistors 324 and 356.

Memory cells 200 and 300 are each coupled to write data line 430 that applies a write data (WD) signal to the drains of transistors 220 and 320 and the gates of transistors 254 and 354. Memory cells 200 and 300 are each coupled to clock line 434 that applies a universal clock (CLK) to the gates of transistors 222, 250, 322 and 350. In addition, memory cells 200 and 300 are each coupled to read data line 438 which outputs a read data (RD) signal.

Memory cells 200 and 300 do not include individual output stages. Instead, memory cells 200 and 300 share output stage 404 that includes cross-coupled transistors 460 and 462, which are essentially identical to transistors 160 and 162, respectively. The sources of transistors 460 and 462 are coupled to power supply terminal 464, the gate of transistor 460 and the drain of transistor 462 are coupled to read data line 438, and the drain of transistor 460 and the gate of transistor 462 are coupled to node 446. In addition, the sources of transistors 256 and 356 are coupled to node 446.

Since memory cells 200 and 300 share write data line 430, only one of the write address signals WA0 and WA1 will be high during a write operation so that the write data signal is written into the selected memory cell. Likewise, since memory cells 200 and 300 share read data line 438, only one of the read address signals RA0 and RA1 will be high during a read operation so that the read data signal is read from the selected memory cell.

Figure 5:
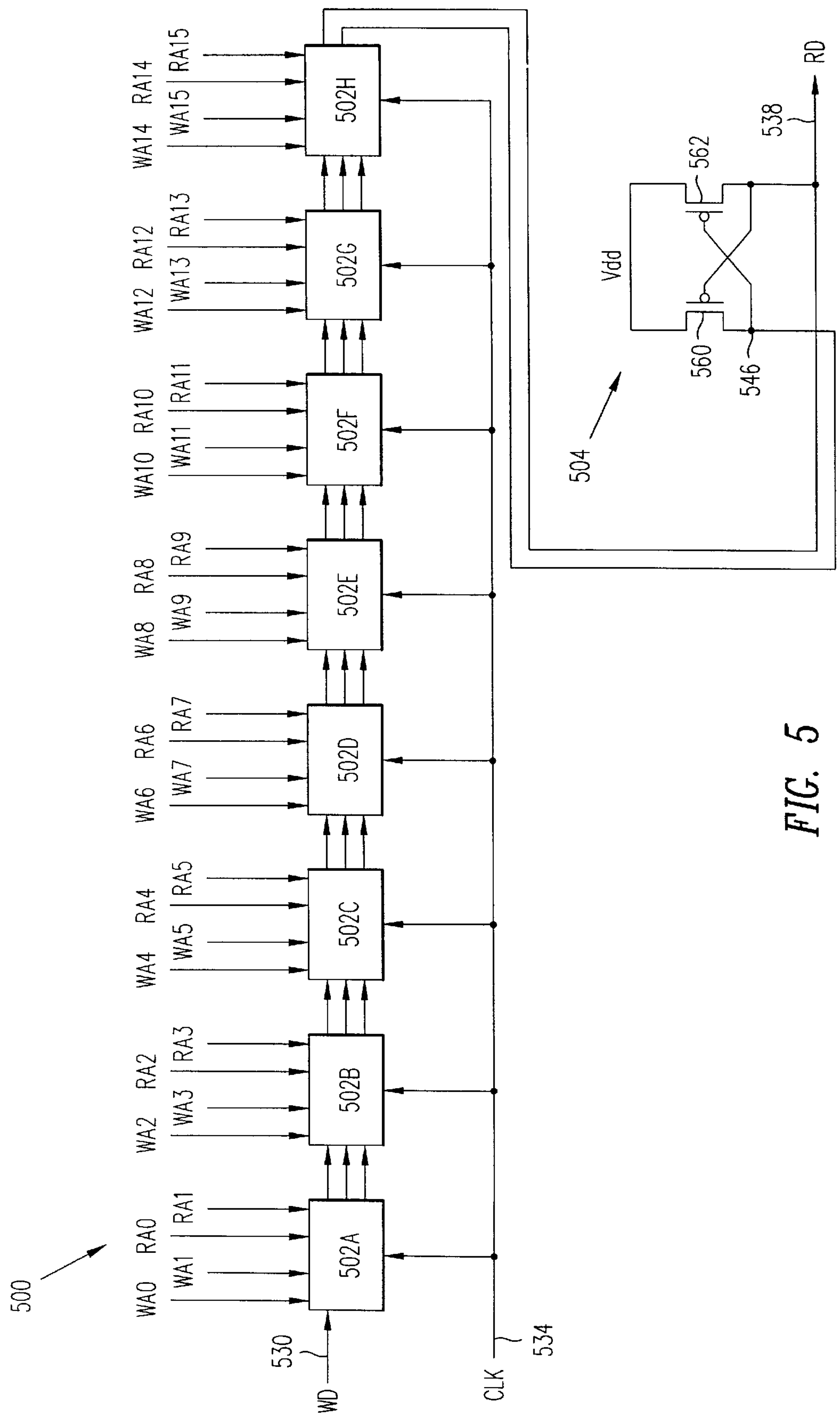
FIG. 5 is a schematic diagram of a register file using the memory cell of FIG. 2.

FIG. 5 is a schematic diagram of a register file. Register fie 500 includes memory cell pairs 502A, 502B, 502C, 502D, 502E, 502F, 502G and 502H, which are each essentially identical to memory cell pair 402. Thus, register file 500 is capable of storing 16 bits. Register file 500 also includes shared output stage 504, which is essentially identical to shared output stage 404. The write address signals and read address signals applied to memory cell pairs 502A–502H are listed below in Table 2.

TABLE 2

| Memory Cell Pair | Write Address Signals | Read Address Signals |
|---|---|---|
| 502A | WA0, WA1 | RA0, RA1 |
| 502B | WA2, WA3 | RA2, RA3 |
| 502C | WA4, WA5 | RA4, RA5 |
| 502D | WA6, WA7 | RA6, RA7 |
| 502E | WA8, WA9 | RA8, RA9 |
| 502F | WA10, WA11 | RA10, RA11 |
| 502G | WA12, WA13 | RA12, RA13 |
| 502H | WA14, WA15 | RA14, RA15 |

Memory cell pairs 502A–502H are each coupled to write data line 530 that applies a write data (WD) signal, clock line 534 that applies a universal clock (CLK), read data line 538 which outputs a read data (RD) signal, and node 546.

Memory cell pairs 502A–502H do not include individual output stages. Instead, memory cell pairs 502A–502H share output stage 504 that includes cross-coupled transistors 560 and 562, which are essentially identical to transistors 460 and 462, respectively.

Since memory cell pairs 502A–502H share write data line 530, only one of the write address signals WA0–WA15 will be high during a write operation so that the write data signal is written into the selected memory cell. Likewise, since memory cell pairs 502A–502H share read data line 538, only one of the read address signals RA0–RA15 will be high during a read operation so that the read data signal is read from the selected memory cell. Preferably, at least one of the read address signals is high at all times.

The present invention includes numerous variations to the embodiments described above. For instance, any suitable switching elements can provide the switching functions of the MOS transistors. The logic levels at various signal lines can be inverted as long as the associated logic is also inverted. The write address signal and the clock can be applied to the gates of transistors 122 and 120, respectively, and the write data signal, write address signal and clock can be applied to various ones of the gates of transistors 150, 152 and 154. Each memory cell can receive multiple read address lines for driving multiple read data lines by replicating the combination of transistors 124 and 156 and inverter 158. The inverters can be implemented in any suitable circuitry, and a wide range of power supply voltages are acceptable.

The present invention is particularly well-suited as a flexible building block for memory structures of a microprocessor embedded in an integrated circuit chip used for low voltage, high speed applications.

Other variations and modifications of the embodiments disclosed herein may be made based on the description set forth herein without departing from the scope and spirit of the invention as set forth in the following claims.

What is claimed is:

1. A semiconductor device, including a pair of memory cells in combination with a shared output stage, comprising:

a first memory cell that provides a first bit of information at a read data line and a complement of the first bit at an inverted information bit node in response to a first read address signal having a first logical value, wherein the first memory cell comprises:

first and second cross-coupled inverters coupled at a first node and a second node for storing a bit of information at the first node and a complement of the bit at the second node;

first and second series-connected switching elements for coupling a write data signal to the first node in response to a write address signal and a clock; and third, fourth and fifth series-connected switching elements for coupling the second node to a power supply terminal in response to the write data signal, the write address signal and the clock;

a second memory cell that provides a second bit of information at the read data line and a complement of the second bit at the inverted information bit node in response to a second read address signal having the first logical value; and a shared output stage that includes first and second cross-coupled transistors, wherein the first transistor includes a control terminal coupled to the inverted information bit node, an output terminal coupled to the read data line, and another output terminal coupled to a power supply terminal, and the second transistor includes a control terminal coupled to the read data line, an output terminal coupled to the inverted information bit node, and another output terminal coupled to the power supply terminal, at least one memory cell of the first and second memory cells including a cross-coupled inverter driven by circuitry external to the cross-coupled inverter.

2. A semiconductor device, including a pair of memory cells in combination with a shared output stage, comprising:

a first memory cell that provides a first bit of information at a read data line and a complement of the first bit at an inverted information bit node in response to a first read address signal having a first logical value, wherein the first memory cell comprises:

first and second cross-coupled inverters coupled at a first node and a second node for storing a bit of information at the first node and a complement of the bit at the second node;

a first switching element for coupling the bit to a read data line in response to a read address signal;

a second switching element for coupling the complement of the bit to a third node in response to the read address signal; and the shared output stage includes:

a third switching element for coupling the read data line to a power supply terminal in response to a first logical value at the third node; and a fourth switching element for coupling the third node to the power supply terminal in response to the first logical value at the read data line;

a second memory cell that provides a second bit of information at the read data line and a complement of the second bit at the inverted information bit node in response to a second read address signal having the first logical value; and a shared output stage that includes first and second cross-coupled transistors, wherein the first transistor includes a control terminal coupled to the inverted information bit node, an output terminal coupled to the read data line, and another output terminal coupled to a power supply terminal, and the second transistor includes a control terminal coupled to the read data line, an output terminal coupled to the inverted information bit node, and another output terminal coupled to the power supply terminal, at least one memory cell of the first and second memory cells including a cross-coupled inverter driven by circuitry external to the cross-coupled inverter.

3. A semiconductor device, including a pair of memory cells in combination with a shared output stage, comprising:

a first memory cell that provides a first bit of information at a read data line and a complement of the first bit at an inverted information bit node in response to a first read address signal having a first logical value, wherein the first memory cell comprises:

first and second cross-coupled inverters coupled at a first node and a second node for storing a bit of information at the first node and a complement of the bit at the second node;

first and second series-connected switching elements for coupling a write data signal to the first node in response to a write address signal and a clock;

third, fourth and fifth series-connected switching elements for coupling the second node to a first power supply terminal in response to the write data signal, the write address signal and the clock;

a sixth switching element for coupling the bit to a read data line in response to a read address signal;

a seventh switching element for coupling the complement of the bit to a third node in response to the read address signal; and the shared output stage includes:

an eighth switching element for coupling the read data line to a second power supply terminal in response to a first logical value at the third node; and a ninth switching element for coupling the third node to the second power supply terminal in response to the first logical value at the read data line;

a second memory cell that provides a second bit of information at the read data line and a complement of the second bit at the inverted information bit node in response to a second read address signal having the first logical value; and a shared output stage that includes first and second cross-coupled transistors, wherein the first transistor includes a control terminal coupled to the inverted information bit node, an output terminal coupled to the read data line, and another output terminal coupled to a power supply terminal, and the second transistor includes a control terminal coupled to the read data line, an output terminal coupled to the inverted information bit node, and another output terminal coupled to the power supply terminal, at least one memory cell of the first and second memory cells including a cross-coupled inverter driven by circuitry external to the cross-coupled inverter.

4. The semiconductor device of claim 3, wherein:

the first and second series-connected switching elements couple the write data signal to the first node in response to the write address signal and the clock having high logical values;

the third, fourth and fifth series-connected switching elements couple the second node to ground in response to the write data signal, the write address signal and the clock having high logical values;

the sixth and seventh switching elements couple the bit to the read data line and couple the complement of the bit to the third node in response to the read address signal having a high logical value;

the eighth switching element couples the read data line to a positive supply voltage in response to the third node having a low logical value; and the ninth switching element couples the third node to the positive supply voltage in response to the read data line having a low logical value.

5. A semiconductor device, including a pair of memory cells in combination with a shared output stage, comprising:

a first memory cell that provides a first bit of information at a read data line and a complement of the first bit at an inverted information bit node in response to a first read address signal having a first logical value;

a second memory cell that provides a second bit of information at the read data line and a complement of the second bit at the inverted information bit node in response to a second read address signal having the first logical value; and a shared output stage that includes first and second cross-coupled transistors, wherein the first transistor includes a control terminal coupled to the inverted information bit node, an output terminal coupled to the read data line, and another output terminal coupled to a power supply terminal, and the second transistor includes a control terminal coupled to the read data line, an output terminal coupled to the inverted information bit node, and another output terminal coupled to the power supply terminal, at least one memory cell of the first and second memory cells including a cross-coupled inverter driven by circuitry external to the cross-coupled inverter;

first and second cross-coupled inverters coupled at a first node and a second node for storing a bit of information at the first node and a complement of the bit at the second node;

first and second series-connected transistors for coupling a write data signal to the first node in response to a write address signal and a clock having high logical values;

a third inverter coupled to the second node for providing the bit at a third node;

a fourth inverter coupled to the third node for providing the complement of the bit at a fourth node;

a third transistor for coupling the third node to a read data line in response to a read address signal having a high logical value;

a fourth transistor for coupling the fourth node to a fifth node in response to the read address signal having a high logical value;

fifth, sixth and seventh series-connected transistors for coupling the second node to ground in response to the write data signal, the write address signal and the clock having high logical values; and the shared output stage includes:

eighth and ninth cross-coupled transistors, wherein the eighth transistor couples the read data line to a positive supply voltage in response to a low logical value at the fifth node, and the ninth transistor couples the fifth node to the positive supply voltage in response to the data read line having a low logical value.

6. An integrated circuit chip, including the semiconductor device of claim 1.

7. The semiconductor device of claim 1 wherein:

at least one memory cell of the first and second memory cells includes a cross-coupled inverter driven by circuitry external to the cross-coupled inverter so that operating speed of the semiconductor device is improved.

* * * * *